United States Patent
Mashita et al.

(10) Patent No.: US 11,152,973 B2
(45) Date of Patent: Oct. 19, 2021

(54) COMMUNICATION APPARATUS

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventors: Makoto Mashita, Mie (JP); Takeshi Hagihara, Mie (JP); Yuanjun Xian, Mie (JP); Nobuyuki Kobayashi, Mie (JP); Akihito Iwata, Osaka (JP); Takehiro Kawauchi, Osaka (JP); Tatsuya Izumi, Osaka (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 77 days.

(21) Appl. No.: 16/790,854

(22) Filed: Feb. 14, 2020

(65) Prior Publication Data

US 2020/0313724 A1    Oct. 1, 2020

(30) Foreign Application Priority Data

Mar. 29, 2019   (JP) .............................. JP2019-066626

(51) Int. Cl.
| | |
|---|---|
| *H04B 3/56* | (2006.01) |
| *H03H 7/01* | (2006.01) |
| *H04B 3/16* | (2006.01) |
| *H04B 3/54* | (2006.01) |
| *H03H 7/38* | (2006.01) |

(52) U.S. Cl.
CPC ............. *H04B 3/56* (2013.01); *H03H 7/0138* (2013.01); *H03H 7/38* (2013.01); *H04B 3/16* (2013.01); *H04B 3/548* (2013.01)

(58) Field of Classification Search
CPC ..... H01F 2017/0093; H04B 3/56; H04B 3/16; H04B 3/548; H03H 7/0138
See application file for complete search history.

(56) References Cited

U.S. PATENT DOCUMENTS

| | | | |
|---|---|---|---|
| 2005/0219006 A1* | 10/2005 | Suenaga | H04L 25/0272 333/12 |
| 2015/0065039 A1* | 3/2015 | Nii | H01F 38/14 455/41.1 |
| 2018/0145716 A1* | 5/2018 | Saito | H04B 1/40 |
| 2019/0386630 A1* | 12/2019 | Higuchi | H04B 3/30 |

FOREIGN PATENT DOCUMENTS

JP    2009-111911 A    5/2009

* cited by examiner

*Primary Examiner* — Sung S Ahn
(74) *Attorney, Agent, or Firm* — Honigman LLP

(57) ABSTRACT

In a communication apparatus, an analog circuit executes an analog process to a differential signal in a condition that a potential of a first conductor is a reference. A communication circuit receives, via a connection circuit, a differential signal obtained by the execution of the analog process of the analog process is executed and generates, based on the received differential signal, a signal with a reference corresponding to a potential of a second conductor. An inductor (a connection element) is connected between the first conductor and the second conductor. The connection circuit includes a circuit element other than a capacitor.

7 Claims, 6 Drawing Sheets

F I G. 3
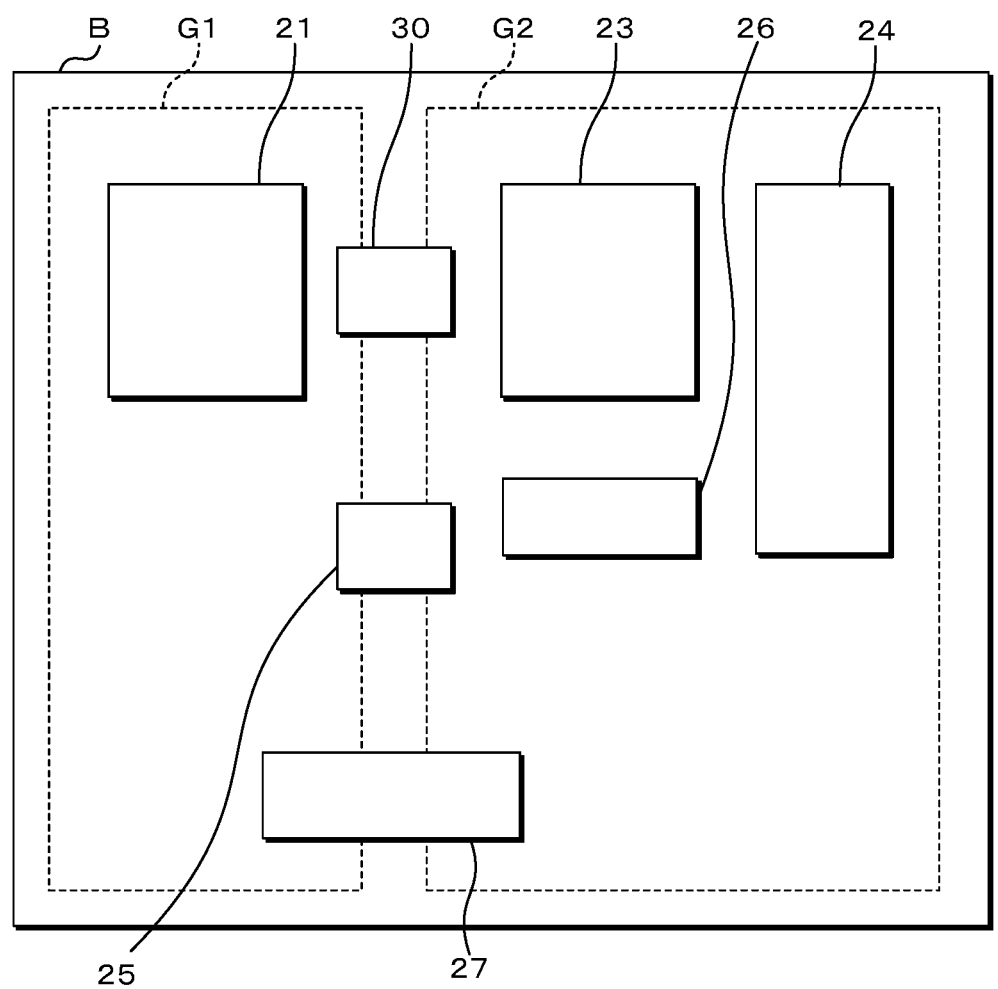

COMMUNICATION APPARATUS

CROSS-REFERENCE TO RELATED APPLICATION

This Nonprovisional application claims priority under 35 U.S.C. § 119(a) to Japanese Patent Application No. 2019-066626 filed in Japan on Mar. 29, 2019, the entire contents of which are hereby incorporated by reference.

FIELD

This disclosure relates to a communication apparatus.

BACKGROUND

A communication system is mounted in a vehicle and in the communication system a plurality of communication apparatuses communicate each other (see Japanese Patent Laid-Open Publication No. 2009-111911, for example). The communication apparatus described in Japanese Patent Laid-Open Publication No. 2009-111911 is an ECU (Electronic Control Unit) and receives a differential signal. In the communication apparatus a differential signal is inputted to an analog circuit. The analog circuit executes an analog process to the inputted differential signal in condition that a ground potential is a reference. A communication circuit receives a differential signal obtained by the execution of the analog process of the analog circuit. The communication circuit converts the received differential signal into a single-ended signal with a reference corresponding to the ground potential, and outputs the converted single-ended signal.

SUMMARY

In the conventional communication apparatus as described in Japanese Patent Laid-Open Publication No. 2009-111911, a high-frequency noise having gotten into the analog circuit gets into the communication circuit. A high-frequency noise having gotten into the communication circuit gets into the analog circuit. In a case where a high-frequency noise getting from one circuit to the other circuit is large in the analog circuit and the communication circuit, an erroneous process may be executed in the circuit containing the high-frequency noise.

In the design of each of the analog circuit and the communication circuit, not only a high-frequency noise getting into the circuit itself but also a high-frequency noise getting from the other circuit have to be taken into consideration. For this reason, there is a problem that the circuitry design of each of the analog circuit and the communication circuit is difficult.

This disclosure has been made with the aim of solving the above problems, and it is an object of this disclosure to provide a communication apparatus in which a high-frequency noise getting from one circuit to the other circuit is small in the analog circuit and the communication circuit.

A communication apparatus according to one aspect of this disclosure comprises: a first conductor and a second conductor; an analog circuit which executes an analog process to a differential signal in a condition that a potential of the first conductor is a reference; a connection circuit which includes a circuit element other than a capacitor and is connected to the analog circuit; a communication circuit which receives, via the connection circuit, a differential signal obtained by the execution of the analog process of the analog circuit and generates, based on the received differential signal, a signal with a reference set as a potential of the second conductor; and a connection element which is a circuit element different from a capacitor and is connected between the first conductor and the second conductor.

According to the aspect above, a high-frequency noise getting from one circuit into the other circuit is small in the analog circuit and the communication circuit.

The above and further objects and features will move fully be apparent from the following detailed description with accompanying drawings.

BRIEF DESCRIPTION OF THE DRAWINGS

FIG. 3 is an explanatory view about arrangements of composition parts of the communication apparatus.

DETAILED DESCRIPTION OF PREFERRED EMBODIMENTS

Figure 1:
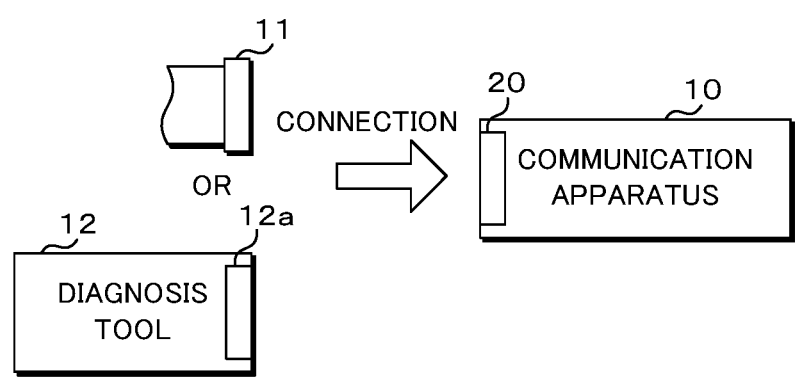
FIG. 1 is an explanatory view of an outline of a communication apparatus according to this Embodiment.

First of all, Embodiment of this disclosure is recited and explained. At least parts of Embodiment described below may be combined arbitrarily.

A communication apparatus according to one aspect of this disclosure comprises: a first conductor and a second conductor; an analog circuit which executes an analog process to a differential signal in a condition that a potential of the first conductor is a reference; a connection circuit which includes a circuit element other than a capacitor and is connected to the analog circuit; a communication circuit which receives, via the connection circuit, a differential signal obtained by the execution of the analog process of the analog circuit and generates, based on the received differential signal, a signal with a reference corresponding to a potential of the second conductor; and a connection element which is a circuit element different from a capacitor and is connected between the first conductor and the second conductor.

In the aspect above, the analog circuit transmits a differential signal obtained by executing the analog process to the communication circuit via the connection circuit which includes the circuit element other than a capacitor. The circuit element is an inductor, a resistor or the like. The connection element is such as an inductor, a resistor or the like and is connected between the first conductor and the second conductor. The connection circuit and the connection element suppress a propagation of a high-frequency noise via themselves, respectively. For this reason, in a case where a high-frequency noise gets into the analog circuit, the high-frequency noise which gets from the analog circuit into the communication circuit is small. Similarly, in a case where a high-frequency noise gets into the communication circuit, the high-frequency noise which gets from the communication circuit into the analog circuit is small.

A communication apparatus according to one aspect of this disclosure comprises: resistor; an input circuit to which a voltage is inputted via the resistor; a first capacitor which is connected between one end of the resistor and the first conductor; and a second capacitor which is connected between the other end of the resistor and the second conductor.

In the aspect above, the resistor and the connection element suppress a propagation of a high-frequency noise via themselves, respectively. For this reason, in a case where a high-frequency noise has gotten into the first conductor, the high-frequency noise which propagates in order of the first capacitor and the resistor is small, and the high-frequency noise which gets from the first conductor into the second conductor is also small. In a case where a high-frequency noise has gotten into the second conductor, the high-frequency noise which propagates in order of the second capacitor and the resistor is small, and the high-frequency noise which gets from the second conductor into the first conductor is also small.

A communication apparatus according to one aspect of this disclosure comprises: a connector which is detachably connected to an external device; and a detection section which detects a connection of the external device to the connector based on a voltage inputted to the input circuit. The external device outputs a voltage via the connector and the resistor to the input circuit.

In the aspect above, when the external device such as a diagnosis tool is connected to the connector, the external device outputs a voltage via the connector and the resistor to the input circuit. A connection of the external device to the connector is detected based on a voltage inputted to the input circuit.

In a communication apparatus according to one aspect of this disclosure, a distance between the resistor and the first conductor is identical with a distance between the resistor and the second conductor.

In the aspect above, the resistor is arranged so that the distance between the resistor and the first conductor is identical with the distance between the resistor and the second conductor. For this reason, a distance between the first conductor and the second conductor is long so as to prevent an electrostatic coupling of the first conductor and the second conductor. In a case where an electrostatic coupling occurs, a capacitor is formed between the first conductor and the second conductor so that a high-frequency noise propagates via this capacitor. Therefore, the connection element does not serve to suppress a propagation of a high-frequency noise.

In a communication apparatus according to one aspect of this disclosure, the analog circuit is provided with a termination circuit which prevents a reflection of a differential signal. The termination circuit is connected to midway portions of two conducting wires via which a differential signal propagates and to the first conductor.

In the aspect above, the termination circuit is connected to the midway portions of the two conducting wires via which a differential signal propagates and to the first conductor. The termination circuit prevents a reflection of a differential signal.

In a communication apparatus according to one aspect of this disclosure, the connection circuit is provided with a common-mode choke coil. The communication circuit transmits a differential signal via the connection circuit.

In the aspect above, the connection circuit is provided with the common-mode choke coil. The common-mode choke coil is provided with two inductors. The two inductors are arranged in midway portions of the two conducting wires connecting the analog circuit to the communication circuit, respectively. A differential signal propagates via the two conducting wires. The common-mode choke coil removes a common mode noise from a differential signal propagating from the analog circuit to the communication circuit. The common-mode choke coil also removes a common mode noise from a differential signal propagating from the communication circuit to the analog circuit.

A communication apparatus according to one aspect of this disclosure comprises a removal device which removes a noise from a direct-current voltage applied to a power line, a reference of the direct-current voltage corresponding to the potential of the first conductor. The removal device applies a voltage obtained by removing the noise to a power line, a reference of the voltage corresponding to the potential of the second conductor. The removal device is provided with an inductor. The inductor is the connection element.

In the aspect above, the removal device removes a noise from a voltage with the reference corresponding to the potential of the first conductor. The removal device applies the voltage obtained by removing the noise to the power line. The reference of the voltage corresponds to the potential of the second conductor. The removal device is a common-mode choke coil, for example, and is provided with an inductor. This inductor is connected between the first conductor and the second conductor as the connection element.

The specific example of the communication apparatus according to Embodiment of this disclosure is explained with reference to the drawings below. Note that the present invention is not limited to these exemplifications, and is defined by the Claims, which intends to include all the meanings equivalent to the Claims and all the modifications within the Claims.

Outline of Communication Apparatus

FIG. 1 is an explanatory view showing an outline of a communication apparatus 10 according to this Embodiment. The communication apparatus 10 is an ECU (Electronic Control Unit), a gateway or the like. The communication apparatus 10 is mounted in a vehicle. The communication apparatus 10 comprises a connector 20. The connector 20 is detachably connected to a cable 11 or a connector 12a of a diagnosis tool 12.

When the cable 11 is connected to the connector 20 of the communication apparatus 10, electric power is supplied via the cable 11 to the communication apparatus 10 so that the communication apparatus 10 operates. The communication apparatus 10 transmits and receives a differential signal via the cable 11 to/from the other communication apparatus which is not illustrated. The communication apparatus 10 transmits and receives a differential signal based on the communication standard called BroadR-Reach, the communication standard of a CAN (Controller Area Network) or the like.

In a case where the communication apparatus 10 is an ECU which controls an operation of a motor locking and unlocking a door of the vehicle, for example, the communication apparatus 10 causes the motor to unlock the door when the communication apparatus 10 receives a differential signal directing the unlocking of the door. For example, in a case where a sensor which detects whether or not a door of a vehicle is locked is connected to the communication apparatus 10, the communication apparatus 10 transmits, to another communication apparatus, a differential signal indicating a detection result of the sensor and notifies the communication apparatus of the detection result.

When the connector 12a of the diagnosis tool 12 is connected to the connector 20 of the communication apparatus 10, the diagnosis tool 12 supplies electric power to the communication apparatus 10 so that the communication apparatus 10 operates. The communication apparatus 10 and the diagnosis tool 12 communicate each other. For example, the communication apparatus 10 transmits, to the diagnosis tool 12, a differential signal containing data used for a detection of a failure, so-called log data. Moreover, the diagnosis tool 12 transmits, to the communication apparatus 10, a differential signal containing update data for updating a computer program run in the communication apparatus 10, for example.

Configuration of Communication Apparatus 10

Figure 2:
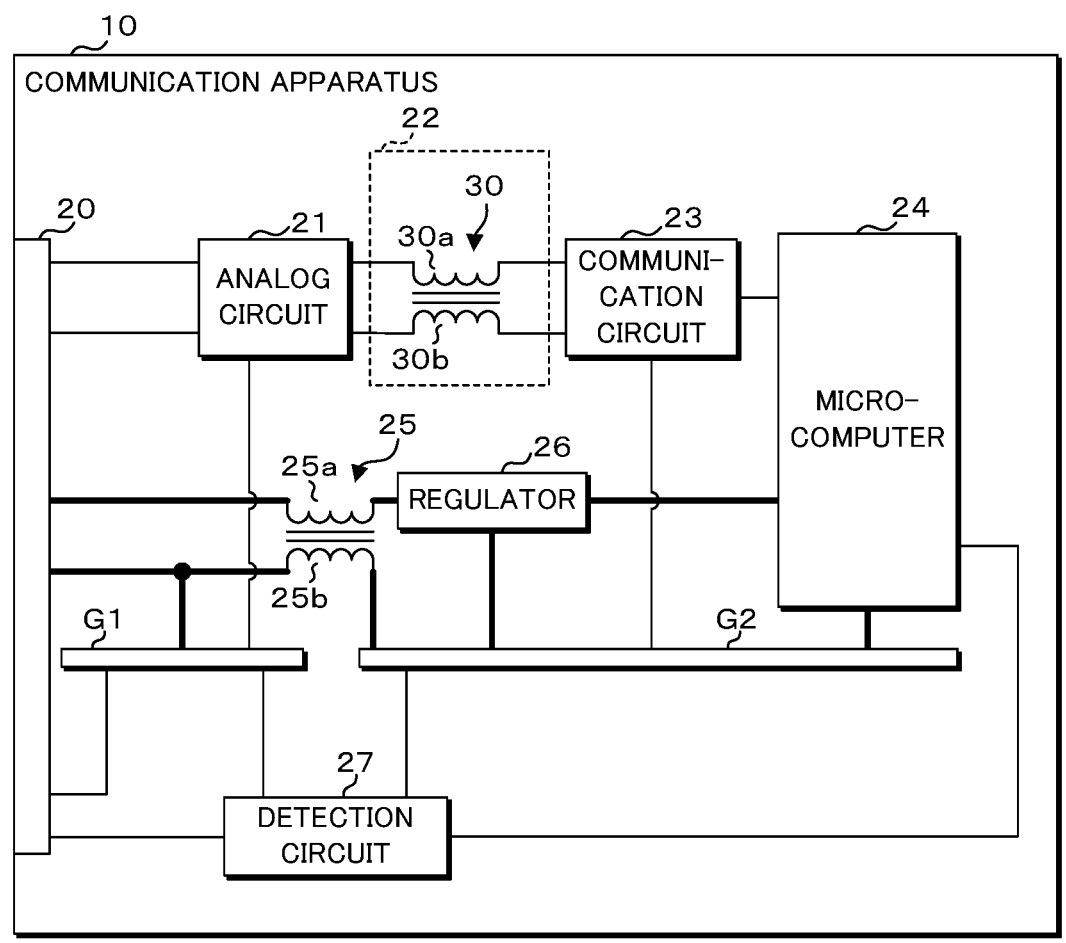
FIG. 2 is a block view showing a configuration of main parts of the communication apparatus.

FIG. 2 is a block view showing a configuration of main parts of the communication apparatus 10. The communication apparatus 10 comprises, in addition to the connector 20, an analog circuit 21, a connection circuit 22, a communication circuit 23, a microcomputer 24, a common-mode choke coil 25, a regulator 26, a detection circuit 27, a first conductor G1 and a second conductor G2. These are connected via conducting wires. The conducting wires used to supply electric power, i.e., power lines are shown in a thick solid line. Each of the first conductor G1 and the second conductor G2 is an object which conducts electricity. Each of the first conductor G1 and the second conductor G2 is metal, for example.

The connection circuit 22 is provided with a common-mode choke coil 30. The common-mode choke coil 30 is provided with a first inductor 30a and a second inductor 30b. In the common-mode choke coil 30, the first inductor 30a and the second inductor 30b are wound around a not-illustrated annular magnetic body. The common-mode choke coil 25 is provided with a first inductor 25a and a second inductor 25b. The common-mode choke coil 25 is configured similarly to the common-mode choke coil 30.

The connector 20 is connected to the analog circuit 21 via two conducting wires. One ends of the first inductor 30a and the second inductor 30b of the common-mode choke coil 30 are also connected to the analog circuit 21 via two conducting wires. The analog circuit 21 is also connected to the first conductor G1 via a conducting wire. The connection to the first conductor G1 is so-called grounding. The other ends of the first inductor 30a and the second inductor 30b of the common-mode choke coil 30 are connected to the communication circuit 23 via two conducting wires. The communication circuit 23 is also connected to the microcomputer 24 and the second conductor G2 via two conducting wires. The connection to the second conductor G2 is so-called grounding.

The connector 20 is also connected to one end of the first inductor 25a of the common-mode choke coil 25 via a conducting wire. The connector 20 is also connected to one end of the second inductor 25b of the common-mode choke coil 25 and to the first conductor G1 via a conducting wire. The other end of the first inductor 25a is connected to the regulator 26 via a conducting wire. The other end of the second inductor 25b is connected to the second conductor G2 via a conducting wire. The regulator 26 is also connected to the microcomputer 24 and the second conductor G2 via two conducting wires. The microcomputer 24 is also connected to the second conductor G2 via a conducting wire.

The connector 20 is also connected to the detection circuit 27 and the first conductor G1 via two conducting wires. The detection circuit 27 is also connected to the microcomputer 24, the first conductor G1 and the second conductor G2 via three conducting wires.

When the cable 11 is connected to the connector 20, the cable 11 is connected to the analog circuit 21, the common-mode choke coil 25 and the first conductor G1. In the conducting wire connecting the connector 20 to the detection circuit 27, one end of the conducting wire on the side of the connector 20 is open.

When the connector 12a of the diagnosis tool 12 is connected to the connector 20, the connector 12a of the diagnosis tool 12 is connected to the analog circuit 21, the common-mode choke coil 25, the detection circuit 27 and the first conductor G1.

A differential signal is inputted from the cable 11 or the diagnosis tool 12 via the connector 20 to the analog circuit 21. The differential signal is a signal indicating binary data such as "0" and "1", and propagates via the two conducting wires. The binary data are indicated by voltage differences of two conducting wire.

The analog circuit 21 executes an analog process to the differential signal inputted from the connector 20 in a condition that a potential of the first conductor G1 is a reference. The communication circuit 23 receives a differential signal obtained by the execution of the analog process of the analog circuit 21 via the common-mode choke coil 30 of the connection circuit 22.

The common-mode choke coil 30 removes a common mode noise from the differential signal obtained by the execution of the analog process of the analog circuit 21 and outputs, to the communication circuit 23, a differential signal in which the common mode noise is removed. The common mode noise is a noise which is superposed in a common mode on two conducting wires via which a differential signal propagates. The connection circuit 22 includes a circuit element other than a capacitor.

The communication circuit 23 generates, based on the received differential signal, a single-ended signal with a reference corresponding to a potential of the second conductor G2, and outputs the generated single-ended signal to the microcomputer 24. The microcomputer 24 reads a voltage of the single-ended signal inputted from the communication circuit 23 in a condition that the potential of the second conductor G2 is the reference. Then the microcomputer 24 obtains data contained in the single-ended signal. The microcomputer 24 executes various processes based on the data contained in the single-ended signal inputted from the communication circuit 23.

The microcomputer 24 outputs, to the communication circuit 23, a single-ended signal with a reference corresponding to the potential of the second conductor G2. The communication circuit 23 generates a differential signal based on the single-ended signal inputted from the microcomputer 24. The communication circuit 23 transmits the generated differential signal via the connection circuit 22, the analog circuit 21 and the connector 20 to a not-illustrated communication apparatus or the diagnosis tool 12. The common-mode choke coil 30 of the connection circuit 22 removes a common mode noise from the differential signal transmitted by the communication circuit 23. The common-mode choke coil 30 outputs, via the analog circuit 21 and the connector 20, a differential signal in which the common mode noise is removed.

A direct-current voltage with the reference corresponding to the potential of the first conductor G1 is inputted from the cable 11 or the diagnosis tool 12 via the connector 20 to the common-mode choke coil 25. The common-mode choke coil 25 removes a common mode noise from the voltage inputted to the first inductor 25a and the second inductor 25b. A voltage, the common mode noise of which is removed by the common-mode choke coil 25, is a voltage with the reference corresponding to the potential of the second conductor G2. The common-mode choke coil 25 applies the voltage obtained by removing the common mode noise to the conducting wire connected to the regulator 26 in the condition that the potential of the second conductor G2 is the reference. The voltage, the common mode noise of which is removed, is outputted to the regulator 26. The common-mode choke coil 25 functions as a removal device. As shown in FIG. 2, the conducting wire connected between the connector 20 and the first inductor 25*a*, the conducting wire connected between the first inductor 25*a* and the regulator 26, and the conducting wire connected between the regulator 26 and the microcomputer 24 are power lines.

The regulator 26 converts the direct-current voltage inputted from the common-mode choke coil 25 to a predetermined set voltage. The set voltage is a direct-current voltage with a reference corresponding to the potential of the second conductor G2. The regulator 26 outputs the converted set voltage to the microcomputer 24. Therefore, electric power is supplied to the microcomputer 24.

Note that the regulator 26 may further output the set voltage to the communication circuit 23 and supply electric power to the communication circuit 23.

When the connector 12*a* of the diagnosis tool 12 is connected to the connector 20, the diagnosis tool 12 continues to output to the detection circuit 27 a direct-current voltage with a reference corresponding to the potential of the first conductor G1. The voltage outputted by the diagnosis tool 12 is equal to or higher than a predetermined threshold voltage. When the connector 12*a* of the diagnosis tool 12 is not connected to the connector 20, a zero V is outputted to the detection circuit 27. Here, the zero V is a voltage with a reference corresponding to the potential of the first conductor G1 and is lower than the threshold voltage.

The detection circuit 27 outputs, to the microcomputer 24, a voltage with a reference corresponding to the potential of the second conductor G2. The detection circuit 27 outputs a zero V or a predetermined voltage Vc (see FIG. 5). In a case where a voltage inputted from the connector 20 is equal to or higher than the threshold voltage, i.e., where the diagnosis tool 12 is connected, the detection circuit 27 outputs the zero V to the microcomputer 24. In a case where a voltage inputted from the connector 20 is lower than the threshold voltage, i.e., where the diagnosis tool 12 is not connected, the detection circuit 27 outputs the predetermined voltage Vc to the microcomputer 24. The microcomputer 24 detects a connection of the connector 12*a* of the diagnosis tool 12 to the connector 20 based on the voltage inputted from the detection circuit 27.

Arrangements of Composition Parts of Communication Apparatus 10

FIG. 3 is an explanatory view about arrangements of composition parts of the communication apparatus 10. The communication apparatus 10 further comprises a rectangular circuit board B. The first conductor G1 and the second conductor G2 are arranged in the circuit board B. The first conductor G1 and the second conductor G2 have shapes of a rectangular plate, respectively. Plate surfaces of the first conductor G1 and the second conductor G2 face a plate surface of the circuit board B. The first conductor G1 and the second conductor G2 are arranged side by side along the plate surface of the circuit board B. The first conductor G1 and the second conductor G2 are covered with insulating resin in a condition that the first conductor G1 and the second conductor G2 do not contact each other.

A through hole and an electrically conductive path, which are not illustrated, are provided in the plate surface of the circuit board B. The electrically conductive path is a so-called circuit pattern. The connection to the first conductor G1 or the second conductor G2 is achieved using the through hole and the electrically conductive path. Specifically, a conductive foil is attached on a surface of the through hole. The conductive foil is communicated with the electrically conductive path. The conducting wire is formed by both of the conductive foil and the electrically conductive path or by the electrically conductive path.

As shown in FIG. 3, the analog circuit 21, which is connected to the first conductor G1 and is not connected to the second conductor G2, is arranged above the first conductor G1. The common-mode choke coil 25 and the detection circuit 27, which are connected to both of the first conductor G1 and the second conductor G2, are arranged above the first conductor G1 and the second conductor G2. The common-mode choke coil 30 of the connection circuit 22, which is not connected to both of the first conductor G1 and the second conductor G2, is also arranged above the first conductor G1 and the second conductor G2. The communication circuit 23, the microcomputer 24 and the regulator 26, which are not connected to the first conductor G1 and are connected to the second conductor G2, are arranged above the second conductor G2.

Configuration of Analog Circuit 21

Figure 4:
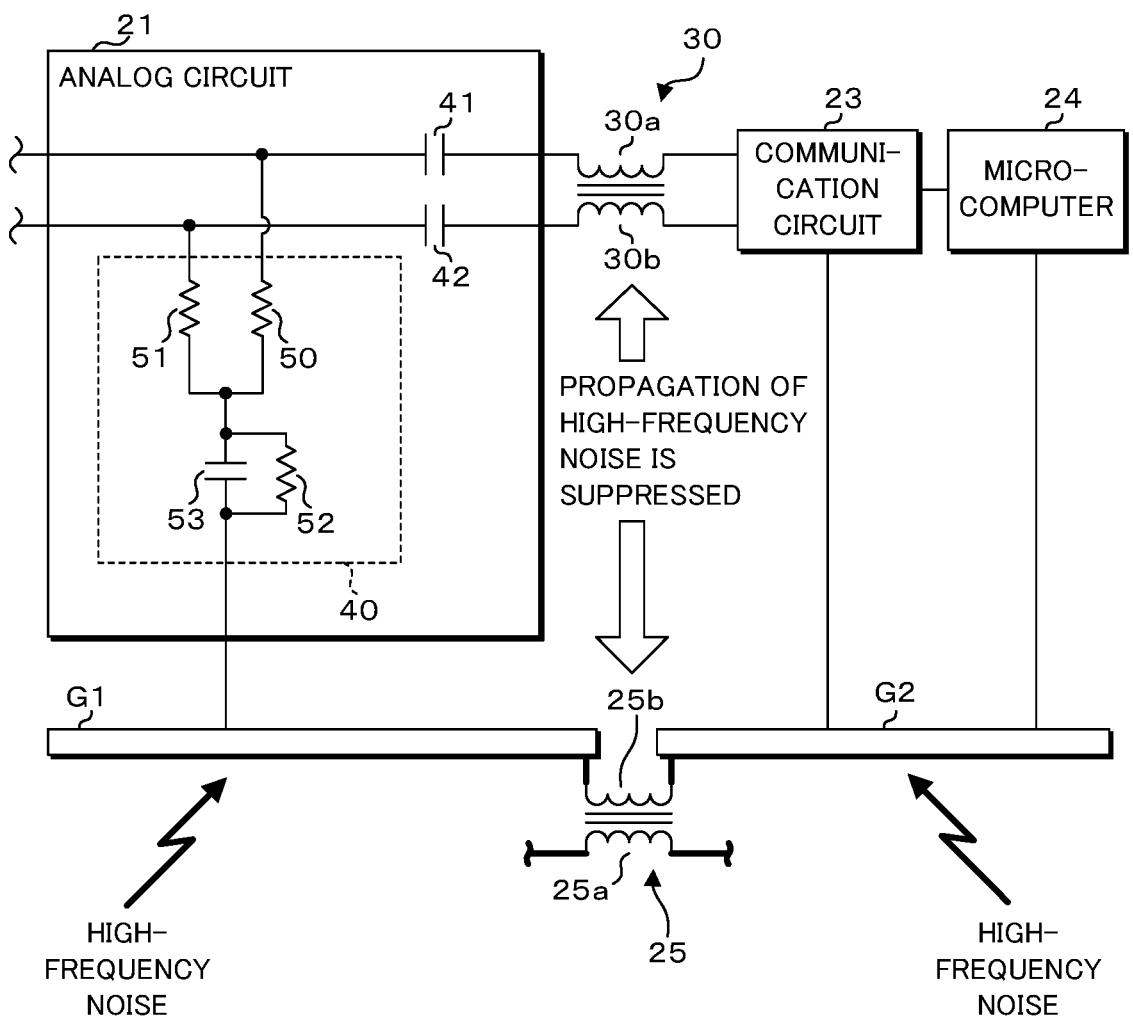
FIG. 4 is an explanatory view of an analog circuit.

FIG. 4 is an explanatory view of the analog circuit 21. The analog circuit 21 is provided with a termination circuit 40 and capacitors 41 and 42. The termination circuit 40 is connected to midway portions of two conducting wires via which a differential signal propagates and to the first conductor G1. One end of the capacitor 41 is connected to the connector 20 and to the termination circuit 40. The other end of the capacitor 41 is connected to one end of the first inductor 30*a* of the common-mode choke coil 30. One end of the capacitor 42 is connected to the connector 20 and to the termination circuit 40. The other end of the connector 42 is connected to one end of the second inductor 30*b* of the common-mode choke coil 30.

The termination circuit 40 executes an analog process for preventing a reflection of a differential signal propagating via two conducting wires. The analog process is a process in the condition that the potential of the first conductor G1 is the reference. The termination circuit 40 is provided with resistors 50, 51, 52 and a capacitor 53. One ends of the resistors 50 and 51 are connected to one ends of the capacitors 41 and 42, respectively. The other ends of the resistors 50 and 51 are connected to one end of the capacitor 53. The other end of the capacitor 53 is connected to the first connector G1. The resistor 52 is connected between both ends of the capacitor 53.

A resistance value of the resistor 50 is a resistance value in consideration of a characteristic impedance of a propagation path of a signal propagating via the conducting wire connected to one end of the resistor 50. The other end of the resistor 50 is grounded via the capacitor 53. This prevents a reflection of a signal propagating via the conducting wire connected to one end of the resistor 50. Similarly, a resistance value of the resistor 51 is a resistance value in consideration of a characteristic impedance of a propagation path of a signal propagating via the conducting wire connected to one end of the resistor 51. The other end of the resistor 51 is grounded via the capacitor 53. This prevents a reflection of a signal propagating via the conducting wire connected to one end of the resistor 51. As a result, the resistors 50 and 51 prevent a reflection of a differential signal propagating via the two conducting wires.

As described above, the analog process executed by the analog circuit 21 is a process for preventing a reflection of a differential signal and is a process executed in the condition that the potential of the first conductor G1 is the reference.

The capacitor 53 is arranged in order to remove a noise propagating via the two conducting wires. A noise propagates from the two conducting wires via the capacitor 53 to the first conductor G1. The capacitor 53 discharges stored electric power via the resistor 52.

The capacitors 41 and 42 are used for an AC (Alternating Current) coupling, respectively. Each of the capacitors 41 and 42 removes a direct-current component from a signal inputted from one end via the conducting wire and outputs, from the other end, a signal in which the direct-current component is removed. Accordingly, the capacitors 41 and 42 remove a direct-current component from a differential signal inputted via the connector 20. The capacitors 41 and 42 also remove a direct-current component from a differential signal transmitted by the communication circuit 23.

Effect of Common-Mode Choke Coils 25 and 30

A high-frequency noise may get into the communication apparatus 10. As an example, a high-frequency noise occurs with the occurrence of static electricity. As another example, a high-frequency noise occurs due to an interference of an electromagnetic field which occurs when a signal propagates via a conducting wire arranged near the communication apparatus 10.

In a case where a high-frequency noise has gotten into the first conductor G1, a predetermined potential fluctuates at high speed. For example, the predetermined potential is a voltage of the first conductor G1, with a reference corresponding to a potential of the ground. A current flowing via the resistors 50 and 51 cannot follow the fluctuation of the voltage of the first conductor G1. For this reason, in the two conducting wires of the common-mode choke coil 30 on the side of the analog circuit 21, a voltage with a reference corresponding to the potential of the first conductor G1 fluctuates at high speed along with the fluctuation of the voltage of the first conductor G1. Therefore, a high-frequency noise gets into the analog circuit 21.

The second inductor 25b of the common-mode choke coil 25 is connected between the first conductor G1 and the second inductor G2. For this reason, even if a voltage of the first conductor G1, with a reference corresponding to the predetermined potential, fluctuates, a voltage of the second conductor G2, with a reference corresponding to the predetermined potential, hardly fluctuates. The second inductor 25b functions as a connection element.

The first inductor 30a of the common-mode choke coil 30 is arranged in a midway portion of one conducting wire connecting the analog circuit 21 to the communication circuit 23. The second inductor 30b of the common-mode choke coil 30 is arranged in a midway portion of the other conducting wire connecting the analog circuit 21 to the communication circuit 23. For this reason, even if voltages of the two conducting wires fluctuate on the side of the analog circuit 21 of the common-mode choke coil 30, voltages of the two conducting wires hardly fluctuate on the side of the communication circuit 23 of the common-mode choke coil 30.

As described above, the common-mode choke coils 25 and 30 suppress a propagation of a high-frequency noise via themselves, respectively. A high-frequency noise which gets from the analog circuit 21 into the communication circuit 23 is small.

In a case where a high-frequency noise has gotten into the second conductor G2, a predetermined potential fluctuates at high speed. For example, the predetermined potential is a voltage of the second conductor G2, with a reference corresponding to the potential of the ground. A current flowing via the communication circuit 23 to the second conductor G2 cannot follow the fluctuation of the voltage of the second conductor G2. For this reason, in the two conducting wires of the common-mode choke coil 30 on the side of the communication circuit 23, a voltage with a reference corresponding to the potential of the second conductor G2 fluctuates at high speed along with the fluctuation of the voltage of the second conductor G2. Therefore, a high-frequency noise to get into the communication circuit 23.

As described above, the first conductor G1 is connected to the second conductor G2 via the second inductor 25b of the common-mode choke coil 25. For this reason, even if a voltage of the second conductor G2, with a reference corresponding to the predetermined potential, fluctuates, a voltage of the first conductor G1, with a reference corresponding to the predetermined potential hardly fluctuates.

The first inductor 30a of the common-mode choke coil 30 is arranged in the midway portion of one conducting wire connecting the analog circuit 21 to the communication circuit 23. The second inductor 30b of the common-mode choke coil 30 is arranged in the midway portion of the other conducting wire connecting the analog circuit 21 to the communication circuit 23. For this reason, even if voltages of the two conducting wires fluctuate on the side of the communication circuit 23 of the common-mode choke coil 30, voltages of the two conducting wires hardly fluctuate on the side of the analog circuit 21 of the common-mode choke coil 30.

As described above, the common-mode choke coils 25 and 30 suppress a propagation of a high-frequency noise via themselves, respectively. A high-frequency noise which gets from the communication circuit 23 into the analog circuit 21 is small.

Configuration of Detection Circuit 27

Figure 5:
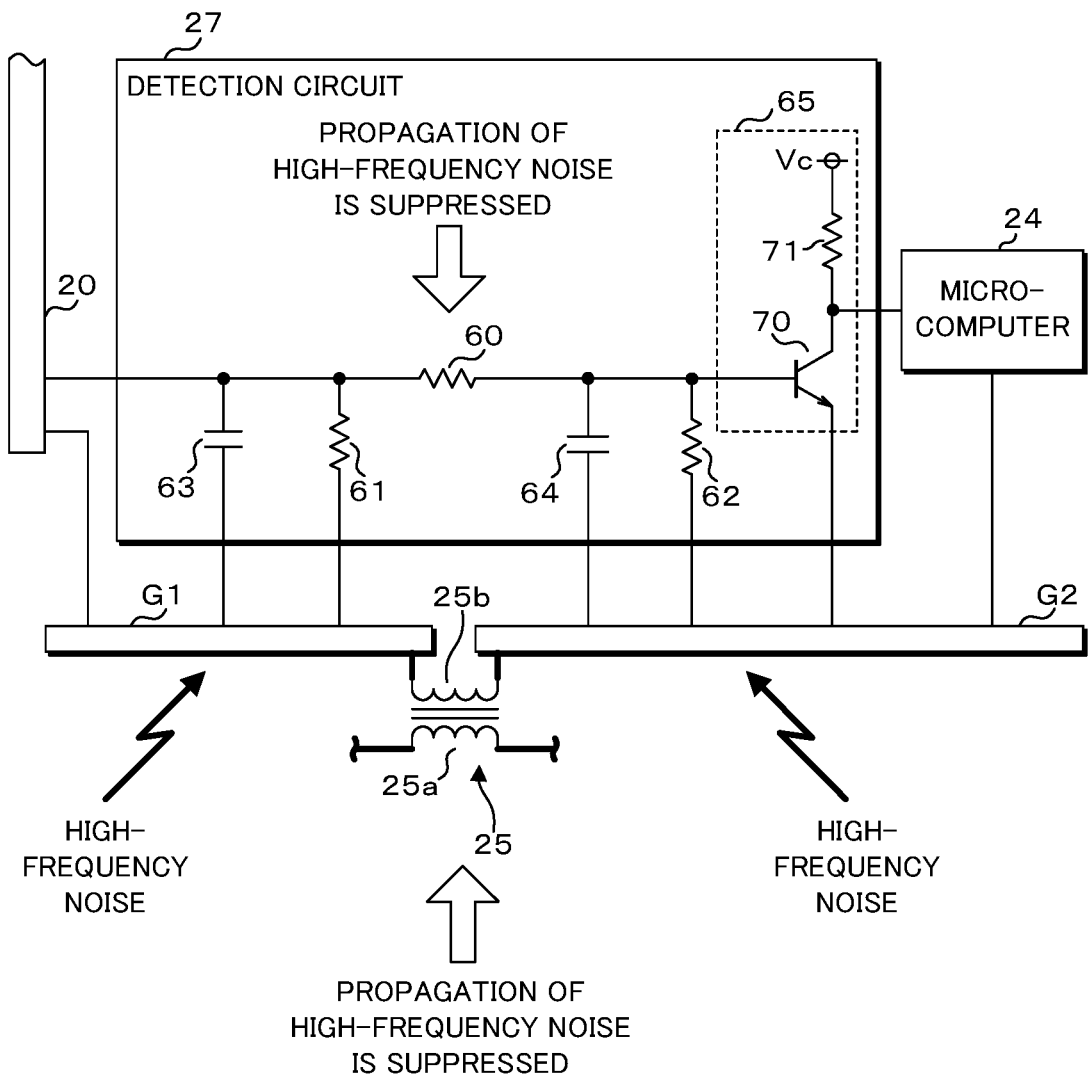
FIG. 5 is an explanatory view of a detection circuit.

FIG. 5 is an explanatory view of the detection circuit 27. The detection circuit 27 is provided with resistors 60, 61, 62, capacitors 63, 64 and an input circuit 65. The input circuit 65 is provided with an NPN-type bipolar transistor 70 and a resistance 71. One end of the resistor 60 is connected to the connector 20 and to one ends of the resistor 61 and the capacitor 63. The other ends of the resistor 61 and the capacitor 63 are connected to the first connector G1. The other end of the resistor 60 is connected to a base of the bipolar transistor 70 provided in the input circuit 65 and to one ends of the resistor 62 and the capacitor 64. The other ends of the resistor 62 and the capacitor 64 are connected to the second connector G2.

As described above, the capacitor 63 is connected between one end of the resistor 60 and the first connector G1. The capacitor 64 is connected between the other end of the resistor 60 and the second connector G2. The capacitor 63 and the capacitor 64 function as a first capacitor and a second capacitor, respectively.

In the input circuit 65, a collector of the bipolar transistor 70 is connected to one end of the resistor 71. A predetermined voltage Vc is applied to the other end of the resistor 71. The predetermined voltage Vc is a constant voltage with a reference corresponding to the potential of the second conductor G2. The predetermined voltage Vc may be the set voltage outputted by the regulator 26, for example. In this case, the regulator 26 applies the predetermined voltage Vc to the other end of the resistor 71. The collector of the bipolar transistor 70 is also connected to the microcomputer 24. An emitter of the bipolar transistor 70 is connected to the second conductor G2.

The bipolar transistor 70 functions as a switch. When a current flows in order of the base and the emitter in the bipolar transistor 70, the bipolar transistor 70 is turned on. When the bipolar transistor 70 is ON, a resistance value between the collector and the emitter is sufficiently small, and a current flows in order of the resistor 71 and the bipolar transistor 70. When the flow of the current via the base and the emitter is stopped in the bipolar transistor 70, the bipolar transistor 70 is turned off. When the bipolar transistor 70 is OFF, a resistance value between the collector and the emitter is sufficiently large, and a current does not flow in order of the resistor 71 and the bipolar transistor 70.

When a voltage inputted from the connector 20, with a reference corresponding to the first conductor G1, is equal to or higher than the above-mentioned threshold voltage, a current flows in order of the base and the emitter in the bipolar transistor 70, and the bipolar transistor 70 is ON. When a voltage inputted from the connector 20, with the reference corresponding to the first conductor G1, is lower than the above-mentioned threshold voltage, a current does not flow in order of the base and the emitter in the bipolar transistor 70, and the bipolar transistor 70 is OFF.

As described above, when the connector 12a of the diagnosis tool 12 is connected to the connector 20, the diagnosis tool 12 outputs to the detection circuit 27, a voltage which is equal to or higher than the threshold voltage, a reference of the voltage corresponding to the potential of the first conductor G1. At this time, a current flows from a plus terminal of the diagnosis tool 12 in order of the resistor 60, the base and the emitter of the bipolar transistor 70, the second conductor G2, the second conductor 25b and the first conductor G1, and returns to a minus terminal of the diagnosis tool 12. For this reason, the bipolar transistor 70 is turned on and a current flows in the input circuit 65 in order of the resistor 71, the bipolar transistor 70 and the second conductor G2. As a result, the input circuit 65 outputs a zero V to the microcomputer 24. The zero V is a voltage with a reference corresponding to the potential of the second conductor G2.

As described above, when the diagnosis tool 12 is connected to the connector 20, the diagnosis tool 12 outputs a direct-current voltage via the connector 20 and the resistor 60 to the base of the bipolar transistor 70 of the input circuit 65. At this time, the input circuit 65 outputs the zero V to the microcomputer 24.

As described above, when the connector 12a of the diagnosis tool 12 is not connected to the connector 20, a zero V is outputted to the detection circuit 27. Here, the zero V is a voltage with a reference corresponding to the potential of the first conductor G1 and is lower than the threshold voltage. When the zero V is outputted to the detection circuit 27, the flow of the current via the base and the emitter is stopped in the bipolar transistor 70, and the bipolar transistor 70 is turned off. Since a current does not flow through the resistor 71 at this time, the predetermined voltage Vc is inputted into the microcomputer 24.

As described above, a voltage equal to or higher than the threshold voltage or a zero V is inputted to the base of the bipolar transistor 70 of the input circuit 65. When the voltage equal to or higher than the threshold voltage is inputted to the input circuit 65, the input circuit 65 outputs the zero V to the microcomputer 24. When the zero V is inputted to the input circuit 65, the input circuit 65 outputs the predetermined voltage Vc to the microcomputer 24.

The microcomputer 24 detects a connection of the diagnosis tool 12 to the connector 20 based on a voltage inputted from the input circuit 65, i.e., a voltage inputted via the resistor 60 to the input circuit 65. The diagnosis tool 12 and the microcomputer 24 function as an external device and a detection section, respectively.

The resistor 60 limits the magnitude of a current flowing in order of the base and the emitter in the bipolar transistor 70. For this reason, a resistance value of the resistor 60 is relatively high. The resistor 61 stabilizes a voltage inputted from the connector 20. The resistor 62 stabilizes a voltage between the emitter and the base in the bipolar transistor 70. The capacitor 63 smooths a voltage outputted from the connector 20 towards the resistor 60. The capacitor 64 smooths a voltage outputted from the connector 20 via the resistor 60.

Effect of Common-Mode Choke Coils 25 and Resistor 60

As described above, a high-frequency noise may get into the communication apparatus 10. In a case where a high-frequency noise has gotten into the first conductor G1, the voltage of the first conductor G1, with the reference corresponding to the predetermined potential, fluctuates at high speed. A current flowing via the capacitor 63 cannot follow the fluctuation of the voltage of the first conductor G1. For this reason, in one end of the resistor 60 on the side of the connector 20, a voltage with a reference corresponding to the potential of the first conductor G1 fluctuates at high speed along with the fluctuation of the voltage of the first conductor G1.

As described above, the first conductor G1 is connected to the second conductor G2 via the second inductor 25b of the common-mode choke coil 25. For this reason, even if a voltage of the first conductor G1, with a reference corresponding to the predetermined potential, fluctuates, a voltage of the second conductor G2, with a reference corresponding to the predetermined potential, hardly fluctuates.

One end of the resistor 60 on the side of the connector 20 is connected via the resistor 61 to the first connector G1. One end of the resistor 60 on the side of the input circuit 65 is connected via the resistor 62 to the second connector G2. For this reason, even if a voltage fluctuates in one end of the resistor 60 on the side of the connector 20, a voltage hardly fluctuates in one end of the resistor 60 on the side of the input circuit 65.

In a case where a high-frequency noise has gotten into the second conductor G2, the voltage of the second conductor G2, with the reference corresponding to the predetermined potential, fluctuates at high speed. A current flowing via the capacitor 64 cannot follow the fluctuation of the voltage of the second conductor G2. For this reason, in one end of the resistor 60 on the side of the connector 20, a voltage with a reference corresponding to the potential of the second conductor G2 fluctuates at high speed along with the fluctuation of the voltage of the second conductor G2.

As described above, the first conductor G1 is connected to the second conductor G2 via the second inductor 25b of the common-mode choke coil 25. For this reason, even if a voltage of the second conductor G2, with a reference corresponding to the predetermined potential, fluctuates, a voltage of the first conductor G1, with a reference corresponding to the predetermined potential, hardly fluctuates.

As described above, one end of the resistor 60 on the side of the connector 20 is connected via the resistor 61 to the first connector G1. One end of the resistor 60 on the side of the input circuit 65 is connected via the resistor 62 to the second connector G2. For this reason, even if a voltage fluctuates in one end of the resistor 60 on the side of the input circuit 65, a voltage hardly fluctuates in one end of the resistor 60 on the side of the connector 20.

As described above, the common-mode choke coil 25 and the resistor 60 suppress a propagation of a high-frequency noise via themselves, respectively. For this reason, in a case where a high-frequency noise has gotten into the first conductor G1, the high-frequency noise which propagates in order of the capacitor 63 and the resistor 60 is small, and the high-frequency noise which gets from the first conductor G1 into the second conductor G2 is also small. In a case where a high-frequency noise has gotten into the second conductor G2, the high-frequency noise which propagates in order of the capacitor 64 and the resistor 60 is small, and the high-frequency noise which gets from the second conductor G2 into the first conductor G1 is also small.

Arrangement of Resistor 60 of Detection Circuit 27

Figure 6:
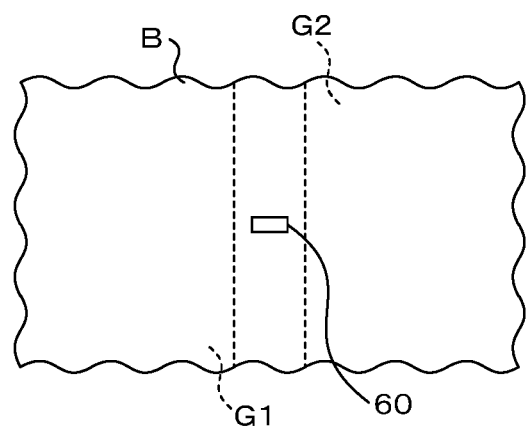
FIG. 6 is an explanatory view of an arrangement of a resistor.
Figure 6:
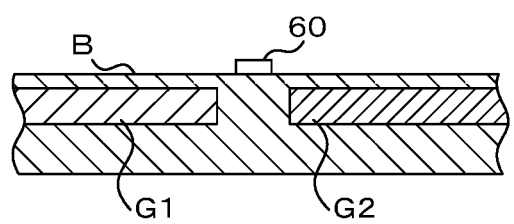

FIG. 6 is an explanatory view of an arrangement of the resistor 60. An upper portion of FIG. 6 shows a part of the plate surface of the circuit board B. A lower portion of FIG. 6 shows a part of a cross-section surface of the circuit board B. The resistor 60 has a shape of a rectangular parallelepiped, and is arranged in a central portion located between the first conductor G1 and the second conductor G2 in a plan view. An end surface of the first conductor G1 faces an end surface of the second conductor G2 along the longitudinal direction of the resistor 60. In the plan view, a distance between the resistor 60 and the first conductor G1 is identical with a distance between the resistor 60 and the second conductor G2. Here, "identical" does not mean "perfect identical" but means "substantial identical".

As shown in the lower portion of FIG. 6, a distance between the resistor 60 and the first conductor G1 is identical with a distance between the resistor 60 and the second conductor G2 in the cross-section surface. Here, "identical" does not mean "perfect identical" but means "substantial identical".

As described above, the resistor 60 is arranged so that the distance between the resistor 60 and the first conductor G1 is identical with the distance between the resistor 60 and the second conductor G2. For this reason, a distance between the first conductor G1 and the second conductor G2 is long, which prevents the occurrence of an electrostatic coupling between the first conductor G1 and the second conductor G2.

In a case where the distance between the first conductor G1 and the second conductor G2 is short, an electrostatic coupling may occur between the first conductor G1 and the second conductor G2. In a case where the electrostatic coupling occurs, a not-illustrated capacitor is formed between the first conductor G1 and the second conductor G2. In this case, a high-frequency noise propagates via the capacitor which is formed by the electrostatic coupling, and the second inductor 25b does not serve to suppress a propagation of a high-frequency noise.

MODIFICATION

In this Embodiment, the communication circuit 23 transmits and receives a differential signal not only when the cable 11 is connected to the connector 20, but also when the diagnosis tool 12 is connected to the connector 20. However, a communication circuit, which transmits and receives a differential signal when the diagnosis tool 12 is connected to the connector 20, may be a communication circuit different from the communication circuit 23. In this case, the communication circuit is further provided with configurations similar to those of the analog circuit 21, the connection circuit 22 and the communication circuit 23. In this case, a communication standard for the communication of the diagnosis tool 12 may be different from the communication standard for the communication via the cable 11.

The circuit element provided in the connection circuit 22 is not limited to the common-mode choke coil 30, but may be a circuit element different from a capacitor. For example, in the connection circuit 22, two resistors may be arranged in midway portions of the two conducting wires connecting the analog circuit 21 to the communication circuit 23, respectively. Moreover, the connection element connected between the first conductor G1 and the second conductor G2 is not limited to the second inductor 25b, but may be a connection element different from a capacitor. For example, a resistor may be connected between the first conductor G1 and the second conductor G2. In this case, the regulator 26 is connected to the connector 20 via an inductor. This inductor removes a noise from a voltage.

A voltage which is outputted via the resistor 60 to the input circuit 65 by the diagnosis tool 12 is not limited to a direct-current voltage indicating a connection, but may be a voltage for a communication signal. That is, the diagnosis tool 12 may transmit a communication signal via the input circuit 65 to the microcomputer 24.

The analog process to be executed by the analog circuit 21 only has to be an analog process in the condition that the reference is the potential of the first conductor G1, and is not therefore limited to the process for preventing a reflection of a differential signal. The analog process to be executed by the analog circuit 21 may be a process for removing a noise, for example. In this case, in the analog circuit 21, one ends of two capacitors are connected in midway portions of the two conducting wires via which a differential signal propagates respectively and the other ends of the two capacitors are connected to the first connector G1, for example.

It is noted that, as used herein and in the appended claims, the singular forms "a", "an", and "the" include plural referents unless the context clearly dictates otherwise.

It is noted that the disclosed Embodiment is illustrated in all aspects and are regarded as not being limitative. The scope of the present invention is defined not by the above meanings but by the Claims, which intends to include all the meanings equivalent to the Claims and all the modifications within the Claims.

What is claimed is:

1. A communication apparatus comprising:
    a first conductor and a second conductor;
    an analog circuit which executes an analog process to a differential signal in a condition that a potential of the first conductor is a reference;
    a connection circuit which includes a circuit element other than a capacitor and is connected to the analog circuit;
    a communication circuit which receives, via the connection circuit, a differential signal obtained by the execution of the analog process of the analog circuit and generates, based on the received differential signal, a signal with a reference corresponding to a potential of the second conductor; and
    a connection element which is a circuit element different from a capacitor and is connected between the first conductor and the second conductor.

2. The communication apparatus according to claim 1, further comprising:
    resistor;
    an input circuit to which a voltage is inputted via the resistor;
    a first capacitor which is connected between one end of the resistor and the first conductor; and a second capacitor which is connected between the other end of the resistor and the second conductor.

3. The communication apparatus according to claim 2, further comprising:
a connector which is detachably connected to an external device; and
a detection section which detects a connection of the external device to the connector based on a voltage inputted to the input circuit, and
wherein the external device outputs a voltage via the connector and the resistor to the input circuit.

4. The communication apparatus according to claim 2, wherein a distance between the resistor and the first conductor is identical with a distance between the resistor and the second conductor.

5. The communication apparatus according to claim 1, wherein the analog circuit is provided with a termination circuit which prevents a reflection of a differential signal, and
wherein the termination circuit is connected to midway portions of two conducting wires via which a differential signal propagates and to the first conductor.

6. The communication apparatus according to claim 1, wherein the connection circuit is provided with a common-mode choke coil, and
wherein the communication circuit transmits a differential signal via the connection circuit.

7. The communication apparatus according to claim 1, further comprising a removal device which removes a noise from a direct-current voltage applied to a power line, a reference of the direct-current voltage corresponding to the potential of the first conductor, and
wherein the removal device applies a voltage obtained by removing the noise to a power line, a reference of the voltage corresponding to the potential of the second conductor,
wherein the removal device is provided with an inductor, and
wherein the inductor is the connection element.

* * * * *